United States Patent
Tohyama

(10) Patent No.: US 8,796,630 B2
(45) Date of Patent: Aug. 5, 2014

(54) THERMAL-TYPE INFRARED SOLID-STATE IMAGE SENSING DEVICE AND METHOD OF MANUFACTURING THE SAME

(75) Inventor: Shigeru Tohyama, Tokyo (JP)

(73) Assignee: NEC Corporation, Tokyo (JP)

( * ) Notice: Subject to any disclaimer, the term of this patent is extended or adjusted under 35 U.S.C. 154(b) by 126 days.

(21) Appl. No.: 13/429,283

(22) Filed: Mar. 23, 2012

(65) Prior Publication Data
US 2012/0241626 A1 Sep. 27, 2012

(30) Foreign Application Priority Data
Mar. 25, 2011 (JP) .................................. 2011-067719

(51) Int. Cl.
*G01J 5/12* (2006.01)
*G01J 5/02* (2006.01)
*H01L 31/18* (2006.01)

(52) U.S. Cl.
CPC .. *G01J 5/12* (2013.01); *G01J 5/024* (2013.01); *H01L 31/1876* (2013.01)
USPC ........................................................ 250/349

(58) Field of Classification Search
CPC ............... G01J 5/20; G01J 5/024; G01J 5/12; H01L 31/1876
USPC ...................................................... 250/339.04
See application file for complete search history.

(56) References Cited

FOREIGN PATENT DOCUMENTS

| JP | 10-163539 A | 6/1998 |
|---|---|---|
| JP | 2009192350 A | 8/2009 |
| JP | 2010101756 A | 5/2010 |

*Primary Examiner* — Marcus Taningco
(74) *Attorney, Agent, or Firm* — Sughrue Mion, PLLC

(57) ABSTRACT

In the reference element employed in the thermal-type infrared solid-state image sensing device according to the present invention, a slit used for construction of a light receiving element is opened in insulating films between which a thermoelectric conversion element is tucked to such an extent that the slit pierces into the sacrifice layer; a film made of electrically conductive material covering the light receiving section and the slit is provided and a protective film is provided thereon, and the film made of electrically conductive material and the protective film enter the interior of the slit along a side wall of the slit, whereby a void is left in the interior of the slit. As a result, residual stresses of the insulating films are kept equal in the light receiving element and the reference element, and thereby, the light blocking effect and the heat transfer effect are improved.

6 Claims, 8 Drawing Sheets

(a) 20a First element (b) 20b Second element (a)

(b)

THERMAL-TYPE INFRARED SOLID-STATE IMAGE SENSING DEVICE AND METHOD OF MANUFACTURING THE SAME

TECHNICAL FIELD

The present invention relates to a thermal-type infrared solid-state image sensing device and a method of manufacturing the thermal-type infrared solid-state image sensing device and, more particularly, to a thermal-type infrared solid-state image sensing device provided with an image sensing section which detects infrared images and a reference section which outputs reference signals based on the environmental temperature and the like, and a method of manufacturing the thermal-type infrared solid-state image sensing device.

BACKGROUND ART

A thermal-type infrared solid-state image sensing device has a plurality of light receiving elements which are arranged in array. Each of the light receiving elements absorbs the infrared rays radiated from an object by use of a light receiving section (diaphragm) having microbridge structure, converts the infrared rays into heat, detects a temperature rise due to the heat by use of a thermoelectric conversion element, such as a bolometer, comprised in the light receiving section (diaphragm), and outputs the temperature rise as an electrical signal. The thermal-type infrared solid-state image sensing device outputs the outputs of the plurality of light receiving elements as time-series signals to the outside by use of a read-out circuit. The thermal-type infrared solid-state image sensing device measures the temperature distribution of the surface of the object by the distribution of the electrical signals thus obtained from the plurality of light receiving elements.

A thermoelectric conversion element, such as a bolometer, detects the intensity of infrared rays by a temperature change caused by the infrared rays which are absorbed, and hence if the environmental temperature and the like change, a drift occurs in the thermal-type infrared solid-state image sensing device, with the result that it becomes impossible to accurately detect the temperature of an object. In order to suppress the drift of an output of the thermal-type infrared solid-state image sensing device due to such variations in the environmental temperature and the like, it is necessary only that the temperature (environmental temperature) of the thermal-type infrared solid-state image sensing device be controlled by use of a temperature controller. However, in this method, it is necessary to separately provide a temperature controller and this complicates the structure of the device and makes the device expensive. Therefore, as a method of suppressing the drift of an output of the thermal-type infrared solid-state image sensing device without using a temperature controller, there have been contrived methods which involve providing a reference element which outputs a reference signal based on the environmental temperature and the like without being influenced by the effect of incident infrared rays and removing a drift caused by variations in the environmental temperature and the like by performing signal processing using the reference signal. The configuration of a reference element of a thermal-type infrared solid-state image sensing device capable of being used in the suppression of a drift caused by variations in the environmental temperature and the like (removal of drift components) without using a temperature controller is disclosed in JP 2009-192350 A.

Referring to FIGS. 6(a) and 6(b), a description will be given of an example of configuration of a conventional thermal-type infrared solid-state image sensing device disclosed in JP 2009-192350 A. FIG. 6(a) shows a sectional view of a light receiving element (first element 20a) which detects incident infrared rays, and FIG. 6(b) shows a sectional view of a reference element (second element 20b) which outputs a "reference signal" for correcting the "drift of an output" of the light receiving element. A circuit substrate 21 is formed from a Si wafer and the like, and a read-out circuit 21a is made in the interior thereof. An infrared reflective film 22 is formed on the circuit substrate 21 and a protective film (not shown) is formed in the upper layer thereof. The light receiving section (temperature detection section 33) is made up of a first protective film 25, a second protective film 27, and a third protective film 29, which absorb infrared rays having wavelengths in the vicinity of 8 μm to 12 μm, a bolometer thin film 26 surrounded by these protective films, and an electrode interconnect 28. A supporting section 32 is made up of the first protective film 25, the second protective film 27, the third protective film 29, and the electrode interconnect 28 which are surrounded by these protective films. In the light receiving element (first element 20a) shown in FIG. 6(a), the supporting section 32 supports the light receiving section (temperature detection section 33) in such a manner as to float the light receiving section (temperature detection section 33) in the air from the circuit substrate 21 via a hollow section 34, thereby realizing a heat separation structure.

In an initial step of device manufacture, the hollow section 34 of the light receiving element (first element 20a) is buried with a first sacrifice layer 24 which is patterned (in the example disclosed in JP 2009-192350 A, a first sacrifice layer made of DLC: diamond-like carbon). In a final step of device manufacture, the hollow section 34 is formed as a result of removal of the first sacrifice layer 24 (for example, the first sacrifice layer made of DLC) by dry etching. On the other hand, in the reference element (the second element 20b shown in FIG. 6(b), the patterned first sacrifice layer 24 remains as it is. As a result, a heat separation structure is not realized and in the reference element (second element 20b), the generated condition is such that the light receiving section (temperature detection section 33) and the circuit substrate 21 which is a heat sink are thermally connected.

Furthermore, in the light receiving element (first element 20a), a eave 31 which absorbs infrared rays having wavelengths in the vicinity of 8 μm to 12 μm extends outward from an end portion of the light receiving section (temperature detection section 33) and covers the upper part of the supporting section 32, thereby functioning as a "eave" which blocks the incidence of infrared rays. Also the infrared rays absorbed by this eave 31 are converted into heat, and the converted heat flows into the light receiving section (temperature detection section 33). Therefore, it is possible to effectively use the space of the supporting section 32 for the detection of infrared rays and it is possible to improve the aperture ratio. On the other hand, in the reference element (second element 20b), the eave 31 is caused to remain in the outermost layer, and this is a "eave" which covers the whole upper part of the temperature detection section 33 and supporting section 32, thereby blocking the incidence of infrared rays. By adopting the configuration in which this eave 31 remains in the outermost layer, it is possible to cause a second sacrifice layer 30 to remain. Furthermore, even when a first slit 35 and a second slit 36 are formed in the step of forming the light receiving section (temperature detection section 33) and the supporting section 32, the second sacrifice layer 30 and the outermost eave 31 remain, with the result that it is impossible to remove the first sacrifice layer 24 (for example, a first sacrifice layer made of DLC) by dry etching and hence it is possible to cause the first sacrifice layer 24 to remain.

In order to increase the accuracy of drift suppression (removal of drift components), it is desired that the resistance and the temperature coefficient of resistance of the bolometer thin film 26 of the light receiving element (first element 20a) and those of the reference element (second element 20b) be equal with each other under the same temperature condition. Because resistant materials used in the fabrication of the bolometer thin film 26 have a piezoresistance effect to no small extent, if the residual stresses of the materials constituting the light receiving section (temperature detection section 33) are not equal, a resistance difference and a difference in the temperature coefficient of resistance due to the piezoresistance effect occur, with the result that the accuracy of drift suppression (removal of drift components) decreases. Providing the first slit 35 and the second slit 36 also in the reference element (second element 20b) is effective in making the residual stresses thereof equal and therefore, the configuration of the reference element (second element 20b) shown in FIG. 6(b) is better than the configuration in which the first slit 35 and the second slit 36 are not provided in the reference element.

Incidentally, in the same manner as with other semiconductor devices, also in thermal-type infrared solid-state image sensing devices, technology development for downsizing has been pushed forward with. The downsizing of a thermal-type infrared solid-state image sensing device is achieved by the downsizing of the light receiving element and the like which constitute the thermal-type infrared solid-state image sensing device. In a light receiving element provided with a light receiving section (temperature detection section) and a supporting section in the same hierarchical layer, the area capable of being allotted to the supporting section decreases if the area of the light receiving section (temperature detection section) is increased, whereas contrastingly the area of the light receiving section (temperature detection section) is reduced if the area occupied by the supporting section is increased; this is unfavorable for downsizing. As in the above-described example of configuration shown in FIG. 6(a), due to the effect of the "eave," it is possible to make the area of light receiving itself wide, making it possible to improve the aperture ratio. However, a decrease in the area of the light receiving section (temperature detection section) reduces the "bolometer thin film volume," causing an increase in 1/f noise. That is, a decrease in the S/N ratio caused by an increase in 1/f noise occurs. Therefore, the configuration in which a relative decrease in the "bolometer thin film volume" can be avoided, for example, a light receiving element separately provided with a light receiving section (temperature detection section) and a supporting section is favorable for downsizing. The configuration of a thermal-type infrared solid-state image sensing device composed of a light receiving element provided with a light receiving section (temperature detection section) and a supporting section in separate hierarchical layers is disclosed in JP 2010-101756 A.

Referring to FIG. 7 and FIGS. 8(a) and 8(b), an explanation will be given of the configuration of the thermal-type infrared solid-state image sensing device disclosed in JP 2010-101756 A. FIG. 7 is a plan view (plan arrangement) showing the configuration of a light receiving element in this thermal-type infrared solid-state image sensing device disclosed in JP 2010-101756 A. FIGS. 8(a) and 8(b) are sectional views of the configuration (sectional configuration) of the light receiving element having the "plan arrangement" shown in FIG. 7. FIG. 8(a) schematically shows the configuration of an element (pixel) in the path from one supporting section to the other supporting section via a light receiving section (diaphragm). However, the division of the bolometer thin films and the metallic interconnect (third interconnect) which connects bolometer thin films are omitted. FIG. 8(b) is a diagram schematically showing the configuration of a plurality of elements (pixels) horizontally arranged side by side in FIG. 7 at the pitch of "light receiving section (diaphragm) length"+ "gap between light receiving sections (diaphragms)", and each element (pixel) shows the section obtained by being cut along the A-A' line shown in FIG. 7.

As shown in FIG. 7 and FIGS. 8(a) and 8(b), the light receiving element in this thermal-type infrared solid-state image sensing device is made up of a light receiving section (diaphragm 38), a pair of supporting sections (a first supporting section 39 and a second supporting section 40) which support the light receiving section (diaphragm 38) in such a manner as to float from a Si substrate with a read-out circuit 45 (the read-out circuit is not shown). In the light receiving section (diaphragm 38), there is formed a bolometer thin film 52 divided into three parts as a temperature change detection mechanism and this bolometer thin film 52 is covered with a third insulating film (protective film) 51 on the lower layer side as well as a fourth insulating film (protective film) 53 and a fifth insulating film (protective film) 55 on the upper layer side. This bolometer thin film 52 is made of vanadium oxide ($V_2O_3$, $VO_x$ etc.), titanium oxide ($TiO_x$) and the like having film thicknesses of the order of 30 nm to 200 nm. The third insulating film (protective film) 51, the fourth insulating film (protective film) 53, and the fifth insulating film (protective film) 55 are formed from a Si oxide film (SiO, $SiO_2$), a Si nitride film (SiN, $Si_3N_4$) or a Si oxynitride film (SiON) and the like. The film thicknesses of the third insulating film (protective film) 51, the fourth insulating film (protective film) 53 and the fifth insulating film (protective film) 55 are on the order of 50 nm to 500 nm, 50 nm to 200 nm, and 50 nm to 500 nm, respectively.

The divided parts of the bolometer thin film 52 are connected in series by a third interconnect 54. The third interconnect 54 is made of aluminum, copper, gold, titanium, tungsten, molybdenum or alloys such as titanium-aluminum-vanadium and the like or semiconductors such as Si to which impurities are added in high concentrations, which have the film thicknesses of the order to 10 nm to 200 nm. The third interconnect 54 is covered with the third insulating film (protective film) 51 on the lower layer side as well as the fourth insulating film (protective film) 53 and the fifth insulating film (protective film) 55 on the upper layer side. Each of the third interconnects 54 provided in end portions of the bolometer thin film 52 which are connected in series, passes through the region narrowed by a slit 44 formed in a position adjacent to the first supporting section 39, and is drawn out up to a first contact section 42, whereby the third interconnect 54 along with the third insulating film (protective film) 51, the fourth insulating film (protective film) 53 and the fifth insulating film (protective film) 55 form the first supporting section 39.

In the above-described first contact section 42, a first interconnect 48 and a second interconnect 49 are formed on a first insulating film (protective film) 47 and connected to the third interconnect 54 by contact holes provided on a second insulating film (protective film) 50, the third insulating film (protective film) 51, and the fourth insulating film (protective film) 53. A first interconnect 48 and a second interconnect 49 are made of aluminum, copper, gold, titanium, tungsten, molybdenum or alloys such as titanium-aluminum-vanadium and the like or semiconductors such as Si to which impurities are added in high concentrations. The film thickness of the first interconnect 48 and the film thickness of the second interconnect 49 are on the order of 50 nm to 200 nm and on the order of 10 nm to 200 nm, respectively. The first interconnect (protective film) 47 and the second interconnect (protective film) 50 are both formed from a Si oxide film (SiO, SiO$_2$), a Si nitride film (SiN, Si$_3$N$_4$) or a Si oxynitride film (SiON) and the like having film thicknesses of the order of 50 nm to 500 nm.

The second interconnect 49 is covered with the first insulating film (protective film) 47 on the lower layer side and the second insulating film (protective film) 50 on the upper layer side, passes a beam 41 which is bent in a complex manner, is drawn out up to a connecting electrode 46 provided on the Si substrate with a read-out circuit 45, and electrically connected to the connecting electrode 46 via the first interconnect 48 formed in a contact hole provided in the first insulating film (protective film) 47. The first insulating film (protective film) 47, the first interconnect 48, the second interconnect 49, and the second insulating film (protective film) 50 form the second supporting section 40 which is made up of the three parts of the first contact section 42, the beam 41, and a second contact section 43. Incidentally, the first interconnect 48 is provided in order to avoid problems, such as the piercing-through of the first contact section 42 during the formation of a contact hole and the step breaking of the second contact section 43 in a stepped part. The first interconnect 48 may not be provided when the film thickness of the second interconnect 49 is such a thickness as might exclude the danger of piercing-through and step breaking.

In the configuration of the thermal-type infrared solid-state image sensing device disclosed in JP 2010-101756 A, as described above, the light receiving section (diaphragm 38) and the beam 41 in the supporting section which determines the thermal separation performance are provided in different level. For this reason, when the area occupied by the beam 41 provided in the lower level is increased, the area occupied by the beam 41 has no effect on the area of the light receiving section (diaphragm 38) provided in the upper level and hence, this does not reduce the area of the light receiving section (diaphragm 38). That is, the configuration in which the light receiving section (diaphragm 38) and the beam 41 are provided in different level, which is disclosed in JP 2010-101756 A, is favorable for downsizing.

PRIOR ART DOCUMENTS

Patent Document

[Patent Document 1] JP 2009-192350 A
[Patent Document 2] JP 2010-101756 A

DISCLOSURE OF THE INVENTION

Problem to be Solved by the Invention

In the configuration disclosed in JP 2009-192350 A shown in FIGS. 6(*a*) and 6(*b*), the light receiving section and the supporting section are provided in a lower level and there is a eave in the interlaying layer above this lower level. For this reason, in the reference element shown in FIG. 6(*b*), it is possible to cause a sacrifice layer (first sacrifice layer 24) to remain even when slits for forming the light receiving section and the supporting section (the first slit 35 and the second slit 36) are provided. However, because the light receiving section and the supporting section are present in the same level, this is unfavorable for downsizing. Therefore, in the case of adoption of the configuration of a thermal-type infrared solid-state image sensing device favorable for downsizing disclosed in JP 2010-101756 A, which is shown in FIGS. 8(*a*) and 8(*b*), also in the reference element, the provision of the slits 44 forming the light receiving section and the first supporting section poses the structural problem that it is impossible to cause a sacrifice layer to remain because of the presence of the light receiving section and the first supporting section formed in the upper level In the case of the adoption of a configuration in which no slit is provided in the reference element in order to cause a sacrifice layer to remain, as described above, a difference in residual stresses applied to the bolometer thin film occurs between the light receiving section and the first supporting section. As a result, a resistance difference and a difference in the temperature coefficient of resistance occur due to the piezoresistance effect caused by the residual stresses, posing the problem in performance that the accuracy of drift suppression (removal of drift components) decreases. It is possible to conceive the idea that a slit is provided and a third sacrifice layer and a protective film corresponding to a eave are provided in a further higher level layer on the light receiving section of the reference element and the first supporting section so that also a sacrifice layer is capable of being caused to remain. In this configuration, however, the step difference on the device surface becomes very large and this poses another new problem in the manufacturing process that the accuracy of resist mask pattern due to a focal shift worsens in the fabrication of a resist mask using a reduced projection exposure device.

An object of the present invention is to provide a thermal-type infrared solid-state image sensing device formed from a light receiving element provided with a light receiving section and a supporting section in different leveled layers as described above, in which a sacrifice layer remains even when slits forming the light receiving section and the supporting section are provided, which is at the same time provided with a reference element having a structure capable of being fabricated by a manufacturing process which does not cause the reduction in the accuracy of a resist mask pattern, and in which in addition, in the reference element, the light blocking effect and the heat transfer effect are high and the accuracy of drift suppression is high due to these effects, and a method of manufacturing this thermal-type infrared solid-state image sensing device.

Means for Solving the Problem

In order to solve the problems described above, the following configuration is employed in the thermal-type infrared solid-state image sensing device according to the present invention. The thermal-type infrared solid-state image sensing device according to the present invention is:

a thermal-type infrared solid-state image sensing device, comprising: on a substrate, an image sensing section in which a plurality of light receiving elements which detect incident infrared rays are arranged in array; and a reference section in which at least one reference element which outputs a reference signal that is free from any influence of incident infrared rays is arranged, wherein the light receiving element and the reference element comprising a light receiving section which comprises a thermoelectric conversion element and a supporting section which supports the light receiving section spaced apart from the substrate, and the supporting section constructed in such a structure interlaying between the substrate and the light receiving section, two ends of which supporting section are respectively connected to the substrate and to the light receiving section, characterized in that the light receiving section of the light receiving element is thermally separated from the substrate by a hollow section that is formed by removing a sacrifice layer, and the light receiving section of the reference element is thermally connected to the substrate through the sacrifice layer which is left without being removed, wherein in the reference element, a slit that is used for forming the light receiving section of the reference element is formed in such a manner as to reach the sacrifice layer by piercing through insulating films between which the thermoelectric conversion element is tucked, at least one or more layers of films made of electrically conductive material are provided at least on the light receiving section and the slit, a protective film is further provided above at least the slit on the film made of electrically conductive material, the film made of electrically conductive material and the protective film cover over a side wall and a bottom portion of the slit, and thereby, a void remains in the interior of the slit, and wherein in the light receiving element, a slit that is used for forming the light receiving section of the light receiving element is formed in such a manner as to pierce through the insulating films or the insulating films and the protective film.

In the thermal-type infrared solid-state image sensing device according to the present invention having the above-described configuration, it is preferred that the film made of electrically conductive material is a layered films in which a film made of a material having a relatively bad step coverage is staked up on a film made of a material having a relatively good step coverage.

And in the thermal-type infrared solid-state image sensing device according to the present invention, it is preferred that the protective film is removed in a predetermined region on the light receiving section or a predetermined region on the supporting section which is formed at the same level as that of the light receiving section.

Furthermore, the thermal-type infrared solid-state image sensing device according to the present invention can be manufactured by a manufacturing method in which the following configuration is selected. The method of manufacturing the thermal-type infrared solid-state image sensing device according to the present invention is:

a method of manufacturing a thermal-type infrared solid-state image sensing device that comprises, on a substrate:

an image sensing section in which a plurality of light receiving elements that detect incident infrared rays are arranged in array, and a reference section in which at least one reference element which outputs a reference signal that is free from any influence of incident infrared rays is arranged;

the light receiving element and the reference element comprising a light receiving section which comprises a thermoelectric conversion element and a supporting section which supports the light receiving section spaced apart from the substrate, and the supporting section composed of a structure interlaying between the substrate and the light receiving section, a first connecting portion which connects one end of the structure and the substrate, and a second connecting portion which connects the other end of the structure and the light receiving section, characterized in that at least, the method comprising the steps of:

forming a first sacrifice layer on the substrate in which a signal read-out circuit is formed with the exception of the area on a terminal electrode of the signal read-out circuit with which the first connecting portion of the supporting section is to be connected;

forming a first insulating film, an lower-layer metallic interconnect, and a second insulating film in the region which is used for construction of the first connecting portion and the structure of the supporting section;

forming a second sacrifice layer in the region which is used for construction of the light receiving section;

forming a third insulating film, an upper-layer metallic interconnect to be connected to the lower-layer metallic interconnect, a fourth insulating film, and a fifth insulating film in the region which is used for formation of the second connecting portion of the supporting section, and coincidentally, in the region which is used for construction of the light receiving section, forming also the third insulating film, the thermoelectric conversion element, the fourth insulating film, an upper-layer metallic interconnect to be connected with the end portion of the thermoelectric conversion element, the fourth insulating film and the fifth insulating film or alternatively forming the third insulating film, the upper-layer metallic interconnect, the fourth insulating film, the thermoelectric conversion element, and the fifth insulating film;

forming the light receiving section of the reference potion by forming a first slit piercing through the third to fifth insulating films in the reference section, forming a film made of electrically conductive material at least on the light receiving section and the first slit of the reference section, and thereafter forming a protective film at least on the first slit, thereby forming a structure in which the film made of electrically conductive material and the protective film cover a side wall and a bottom of the first slit and a void remains in the first slit; and forming the light receiving section of the image sensing section by forming a second slit piercing though the third to fifth insulating films or though the third to fifth insulating films and the protective film in the image sensing section, and removing the first sacrifice layer and the second sacrifice layer of the image sensing section via the second slit.

Effect of the Invention

In the thermal-type infrared solid-state image sensing device of the present invention, the reference element is such that the slit which forms the light receiving section in the insulating film (protective film) which comprises the thermoelectric conversion element in the interior thereof is opened up to the sacrifice layer, at least one or more layers of films of electrically conductive material which cover at least the light receiving section and the slit section are provided, and the protective film is further provided above at least the slit on the film of electrically conductive material. Therefore, it is possible to realize such configuration that the sacrifice layer of the reference element is protected and remains also during etching for forming of the hollow section by removing the sacrifice layer of the light receiving element. Although in the slit of the reference element, there are the film of electrically conductive material without a slit and the protective film thereon, they enter the slit along the side wall of the slit and a void remains within the slit. Therefore, the effect of providing the slit is kept as it is. The film of electrically conductive material is present between the insulating film (protective film) including the thermoelectric conversion element in the interior thereof and the protective film on the film of electrically conductive material and serves as a buffer material between the two protective films. Therefore, it is possible to increase the residual stress reducing effect compared to the direct contact of the protective films. Furthermore, the light blocking effect against incident infrared rays is improved by the film of electrically conductive material and in addition, the heat transfer effect of dissipating heat with good efficiency is also improved.

If this film of electrically conductive material is a stacked film of a material film having a relatively good step coverage and a material film having a relatively bad step coverage, it is possible to positively achieve electrical stabilization by a constant potential to the whole film of electrically conductive material through the use of the material film having a relatively good step coverage which coats the side wall of the slit and it is possible to realize the configuration in which the void is caused to remain in the slit even when the light blocking effect is increased by increasing the film thickness of the surface layer through the use of the material film having a relatively bad step coverage which is stacked.

And in the case of the adoption of the configuration in which the protective film on the film of electrically conductive material is removed in a predetermined region on the light receiving section or on the supporting section formed in the same level as the light receiving section, it is possible to reduce the residual stresses of the protective material itself on the film of electrically conductive material.

Furthermore, the method of manufacturing a thermal-type infrared solid-state image sensing device of the present invention comprises at least the step of forming a slit which pierces through the insulating film (protective film) which comprises a thermoelectric conversion element in the interior thereof only in the reference section after manufacture before the formation of slits forming the light receiving element and the light receiving section of the reference element by a conventional method, the step of forming a film of electrically conductive material and forming a protective film after the removal of the film of electrically conductive material except at least the area on the reference section and the slit, the step of forming a slit which pierces through the insulating film (protective film) which comprises a thermoelectric conversion element in the interior thereof only in the image sensing section, and the step of removing the sacrifice layer of the image sensing section via the slit of the image sensing section, whereby it is possible to realize the manufacture of the thermal-type infrared solid-state image sensing device of the present invention having the above-described configuration.

BRIEF DESCRIPTION OF THE DRAWINGS

FIG. 6(a) is a sectional view schematically showing the configuration of a light receiving element (first element 20a) which detects incident infrared rays, and FIG. 6(b) is a sectional view schematically showing the configuration of a reference element (second element 20b) used for correcting the light receiving element, respectively.

FIG. 8(a) is a sectional view schematically showing the section of the part indicated by A-A' in FIG. 7 with attention paid to one pixel of a light receiving element, and FIG. 8(b) is a sectional view schematically showing a positional relation between adjacent pixels with respect to the arrangement of a light receiving section and a supporting section.

DESCRIPTION OF SYMBOLS

Figure 1:
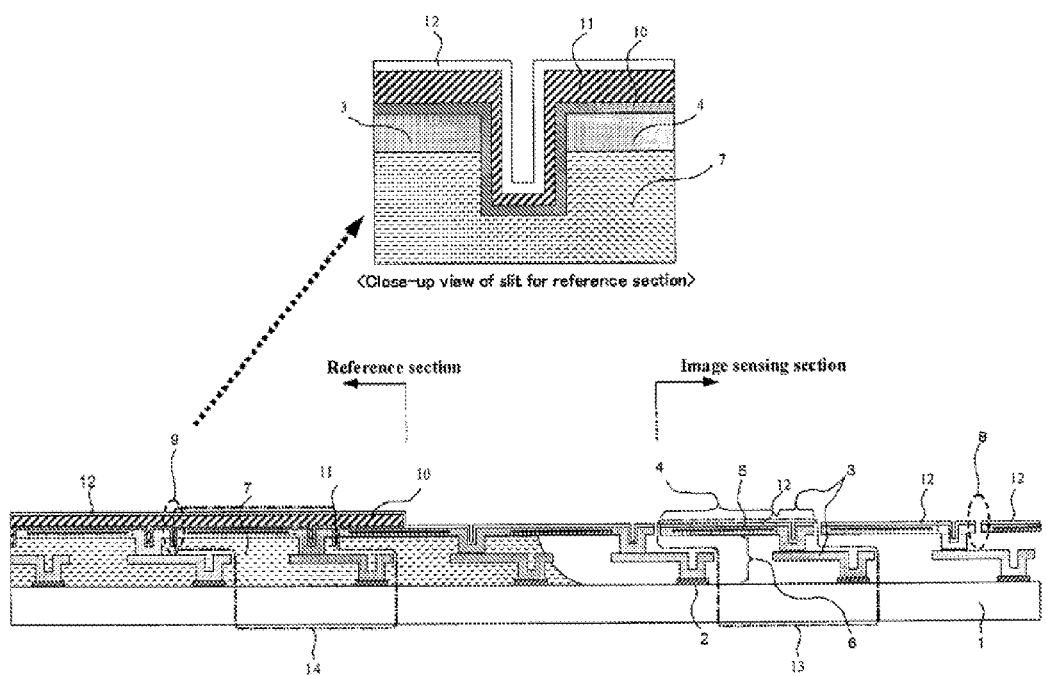
FIG. 1 is a sectional view showing the configuration of a thermal-type infrared solid-state image sensing device according to a first embodiment of the present invention.

In the aforementioned drawings, reference symbols described below have the following meanings.
1 Si substrate with a read-out circuit
2 Connecting electrode
3 Supporting section
4 Light receiving section (diaphragm)
5 Bolometer thin film
6 Hollow section
7 Sacrifice layer
8 Image sensing section slit
9 Reference section slit
10 Light blocking Ti film (lower layer of film made of light blocking electrically conductive material)
11 Light blocking Al film (upper layer of film made of light blocking electrically conductive material)

12 SiN film for protecting a film made of light blocking electrically conductive material or sacrifice layer
13 Light receiving element (unit pixel)
14 Reference element (unit pixel)
15 SiN film used for construction of light receiving section
16 Photoresist mask
17 Reference section slit pattern
18 Photoresist mask
19 Image sensing section slit pattern
20a First element
20b Second element
21 Circuit substrate
21a Read-out circuit
22 Reflective film
23 Contact
24 First sacrifice layer (DLC)
25 First protective film
26 Bolometer thin film
27 Second protective film
28 Electrode interconnect
29 Third protective film
30 Second sacrifice layer
31 Eave
32 Supporting section
33 Temperature detection section
34 Hollow section
35 First slit
36 Second slit
37 Third slit
38 Diaphragm
39 First supporting section
40 Second supporting section
41 Beam
42 First contact section
43 Second contact section
44 Slit
45 Si substrate with a read-out circuit
46 Connecting electrode
47 First insulating film
48 First interconnect
49 Second interconnect
50 Second insulating film
51 Third insulating film
52 Bolometer thin film
53 Fourth insulating film
54 Third interconnect
55 Fifth insulating film

[Best Mode for Carrying Out the Invention]

For a thermal-type infrared solid-state image sensing device according to the present invention and a manufacturing method of the thermal-type infrared solid-state image sensing device, a detailed explanation will be given of a typical embodiment thereof with reference to the drawings.

FIG. 1 is a sectional view showing the configuration of a thermal-type infrared solid-state image sensing device according to the first embodiment of the present invention. As shown in FIG. 1, in the thermal-type infrared solid-state image sensing device according to the first embodiment, on a Si substrate with a read-out circuit 1 (the read-out circuit is not shown), there are provided a light receiving section in which a plurality of light receiving elements (unit pixels) 13 are arranged and a reference section in which at least one or more reference elements (unit pixels) 14 are arranged. On the Si substrate with a read-out circuit 1, there are provided a connecting electrode 2 which is electrically connected to the read-out circuit and an infrared reflective film (not shown), and a protective film (not shown) formed in the upper layer thereof.

Figure 7:
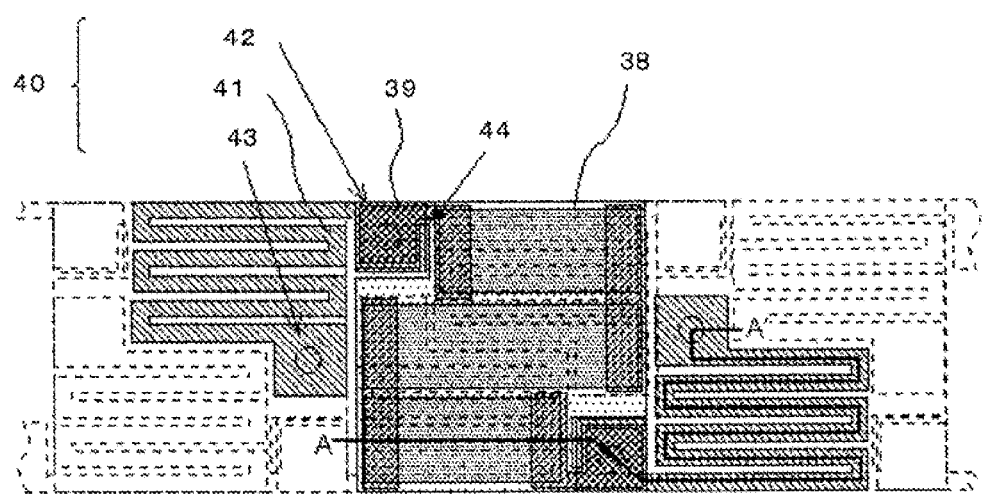
FIG. 7 is a plan view schematically showing a plan arrangement of the configuration of a thermal-type infrared solid-state image sensing device disclosed in JP 2010-101756 A.
Figure 8:
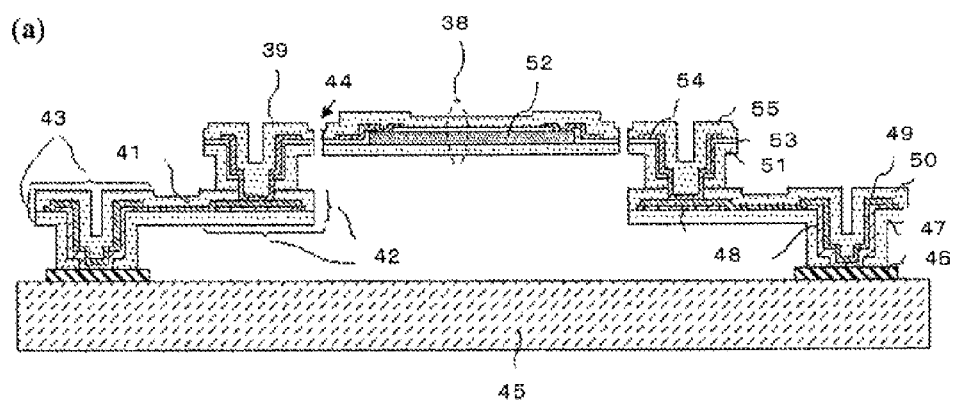
FIGS. 8(a) and 8(b) are sectional views showing the configuration of the thermal-type infrared solid-state image sensing device whose configuration is shown in FIG. 7 and which is disclosed in JP 2010-101756 A.
Figure 8:
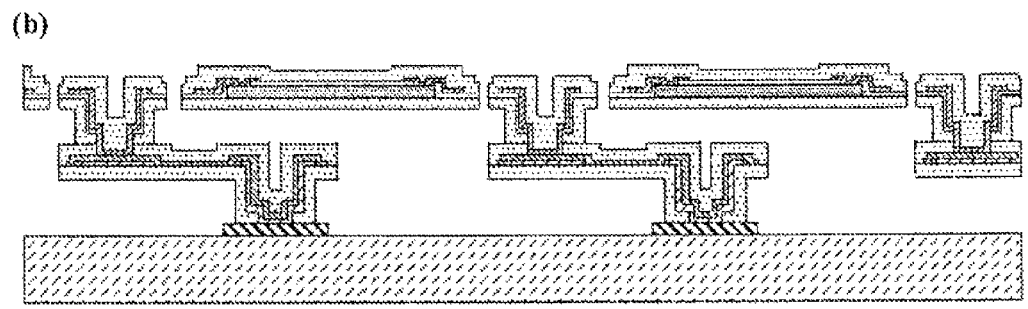

The light receiving element (unit pixel) shown in FIG. 1 has basically the same structure as the light receiving element (unit pixel) disclosed in JP 2010-101756 A, which is shown in FIG. 7 and FIGS. 8(a) and 8(b). That is, the light receiving element (unit pixel) 13 is made up of a light receiving section (diaphragm) 4 which absorbs incident infrared rays and a pair of supporting sections 3 which support the light receiving section (diaphragm) 4 in such a manner as to float the light receiving section (diaphragm) 4 from the Si substrate with a read-out circuit 1 (one of the supporting sections is not shown in the section because the same section as the section obtaining by cutting along the A-A' line of FIG. 7). Also materials, film thicknesses, fabrication conditions and the like used in forming a bolometer thin film 5, an insulating layer (protective film) of each layer which constitute the light receiving section (diaphragm) 4 and the supporting section 3, and an interconnect of each layer, are the same as the materials, film thicknesses, fabrication conditions and the like disclosed in JP. 2010-101756 A. However, in the upper layer of the area (first supporting section) positioned in the same level as the light receiving section (diaphragm) 4 and the light receiving section (diaphragm) 4 of the supporting section 3, there is formed a light blocking film of electrically conductive material or a sacrifice film protecting SiN film 12, which is not present in the light receiving element (unit pixel) disclosed in JP 2010-101756 A. The film thicknesses of the bolometer thin film 5 and each of the insulating films (protective films) which constitute the light receiving section (diaphragm) 4 are adjusted so that the total film thickness of the whole light receiving section (diaphragm) 4 obtained by adding the film thickness of the film made of light blocking electrically conductive material or the SiN film 12 for protecting the sacrifice layer becomes a desired thickness.

On the other hand, also the light receiving section (diaphragm) 4 and the supporting section 3 which constitute the reference element (unit pixel) 14 have basically the same construction as the light receiving element disclosed in JP 2010-101756 A. Materials, film thicknesses, fabrication conditions and the like used in forming the bolometer thin film 5, the insulating layer (protective film) of each layer used to form the reference element (unit pixel) 14 and the interconnect of each layer, are the same as the materials, film thicknesses, fabrication conditions and the like used in forming the light receiving element (unit pixel) 13. However, the thickness of the area positioned in the same level as the light receiving section (diaphragm) 4 of the supporting section 3 and the light receiving section (diaphragm) 4 which are used in the reference element (unit pixel) 14 is smaller than the total film thickness including SiN film for protecting the film made of light blocking electrically conductive material or the sacrifice layer 12 of the light receiving element 13 (unit pixel), because of the nonexistence of the SiN film 12 for protecting the sacrifice layer just above this area. In the reference element (unit pixel) 14, a sacrifice layer 7 remains in the lower layer of the light receiving section (diaphragm), generating a condition in which the light receiving section (diaphragm) 4 and the Si substrate with a read-out circuit 1 are thermally connected. The sacrifice layer 7 remains up to some midpoint of the transition region between the reference section and the image sensing section.

On the area (first supporting section) positioned in the same level as the light receiving section (diaphragm) 4 and the light receiving section (diaphragm) 4 of the supporting section 3, there is formed a film of electrically conductive material made up of a two-layer film of a light blocking Ti film (the lower layer of the film made of light blocking electrically conductive material) 10 and a light blocking Al film (the upper layer of the film made of light blocking electrically conductive material) 11. In addition to titanium having a relatively good step coverage, tungsten or alloys such as titanium-tungsten, titanium-aluminum-vanadium, titanium nitride and the like, or semiconductors to which impurities are added in high concentrations can be used as the film of electrically conductive material used in forming the light blocking Ti film (the lower layer of the film made of light blocking electrically conductive material) 10. In addition to aluminum having a relatively bad step coverage, copper, gold and the like can be used as the film of electrically conductive material used in forming the light blocking Al film (the lower layer of the film of light blocking electrically conductive material) 11. Furthermore, in place of the film made of electrically conductive material composed of a two-layer film, this film made of electrically conductive material may be formed in the shape of a single layer or multiple layered film composed of three or more layers. The film made of electrically conductive material is formed in a single spread to the whole reference section up to an area where the film made of electrically conductive material completely covers the reference element 14 at an end portion of the reference section, and the film made of electrically conductive material is connected to GND (is grounded) to be electrically stabilized, for example. The SiN film 12 for protecting the film made of light blocking electrically conductive material or the sacrifice layer covers the film made of electrically conductive material, and the light blocking film of electrically conductive material or the sacrifice layer protecting SiN film 12 remains continuously as the topmost layer of the transition region without a film of electrically conductive material and furthermore, as the topmost layer of the light receiving element (unit pixel) 13 of the image sensing section. In addition to SiN, a Si oxide film (SiO, $SiO_2$) or a Si nitride film (SiON) and the like can be used as the SiN film 12 for protecting the film of light blocking electrically conductive material or the sacrifice layer.

In a reference section slit 9, as shown in the enlarged view, the configuration is such that a "void" remains in the slit 9 at the instant when the films of electrically conducive material (the light blocking Ti film 10 and the light blocking Al film 11) as well as the SiN film 12 for protecting the film of light blocking electrically conductive material or the sacrifice layer enter the slit 9 along the side wall of the slit 9 and the protective SiN film 12 is deposited. In a manner adapted to the width of the slit 9, the film thicknesses of the light blocking Ti film (the lower layer made of the film of light blocking electrically conductive material) 10, the light blocking Al film (the upper layer of the film made of light blocking electrically conductive material) 11, and the SiN film 12 for protecting the film made of light blocking electrically conductive material or the sacrifice layer is set so that such a configuration is obtained. The light blocking Ti film (the lower layer of the film made of light blocking electrically conductive material) 10, which is formed of a material having a relatively good step coverage, and the SiN film 12 for protecting the film made of light blocking electrically conductive material or the sacrifice layer are formed also on the side wall of the slit 9 with a film thickness of the same order as the film thickness of the surface layer although it is dependent On the characteristics of the device which is used for deposition; and the film which is formed from a material having a relatively bad step coverage (the light blocking Al film (the upper layer of the film made of light blocking electrically conductive material) 11) is formed on the side wall of the slit 9 with a film thickness of the order of about 1/10 of the film thickness of the surface layer. For example, in the case where the width of the slit 9 is 0.5 μm, when the film thickness of the surface layer of the light blocking Ti film (the lower layer of the film made of light blocking electrically conductive material) 10 is set to 50 nm, the film thickness of the surface layer of the light blocking Al film (the upper layer of the film made of light blocking electrically conductive material) 11 is set to 250 nm and the film thickness of the surface layer of the SiN film 12 for protecting film made of light blocking electrically conductive material or the sacrifice layer is set to 50 nm, films having a thickness of 0.25 μm as a total of both sides of the slit 9 are formed and hence a void having a width of 0.25 μm remains within the slit 9. At the boundary between the reference section and regions other than the reference section, a step is formed due to the existence or nonexistence of the surface layer of the light blocking Ti film (the lower layer of the film made of light blocking electrically conductive material) 10 and the surface layer of the light blocking Al film (the upper layer made of the film of light blocking electrically conductive material) 11. Because the formed step has the size of 300 nm, which is a total of the film thickness 50 nm of the surface layer of the light blocking Ti film (the lower layer of the film made of light blocking electrically conductive material) 10 and the film thickness 250 nm of the surface layer of the light blocking Al film (the upper layer of the film made of light blocking electrically conductive material) 11, the step is by far smaller than steps which are caused by the existence or nonexistence of sacrifice layers with thicknesses of several micrometers usually used. Because the formed step has the size of 300 nm, the worsening of the accuracy of resist mask pattern due to a focal shift does not occur.

By employing the above-described configuration in the part of the reference section slit 9, it is possible to obtain a thermal-type infrared solid-state image sensing device in which the residual stresses of the protective film which comprises the thermoelectric conversion element in the interior thereof is made equal in the light receiving element 13 and the reference element 14, in addition, the light blocking effect and heat transfer effect of the reference element 14 are high, and the accuracy of drift control is high.

Next, referring to the drawings, an explanation will be given of a method of manufacturing the thermal-type infrared solid-state image sensing device according to the first embodiment of the present invention, which is applied to the manufacture of the thermal-type infrared solid-state image sensing device according to the first embodiment of the present invention shown in FIG. 1.

First, by applying part of the steps of the manufacturing process disclosed in JP 2010-101756 A, production is performed up to before the formation of the slits which form the light receiving element and the light receiving section of the reference element. By taking the step of manufacturing the thermal-type infrared solid-state image sensing device of the configuration shown in FIG. 7 and FIGS. 8(a) and 8(b) as an example, an explanation will be given of the conventional manufacturing method (the manufacturing process disclosed in JP 2010-101756 A) with reference to the drawings.

First, by applying a usual Si integrated circuit manufacturing process, a Si substrate with a read-out circuit 45 is prepared which is provided with a signal read-out circuit (not shown), a metallic reflective film (not shown), and a plurality of connecting electrodes 46, which are terminal electrodes of the signal read-out circuit.

Next, a first sacrifice layer used for forming a void between a second supporting section 40 and the Si substrate with a read-out circuit 45 is formed on the Si substrate with a read-out circuit 45 with the exception of a second contact section 43 which connects the second supporting section 40 and the connecting electrode 46. The first sacrifice layer is formed, for example, by applying photosensitive polyimide, performing patterning by exposure and development, and thereafter being subjected to heat treatment. The thickness of the first sacrifice layer is on the order of 0.5 μm to 3 μm, for example.

Next, a first insulating film 47 is deposited by the plasma CVD method and the like in such a manner as to cover the first sacrifice layer. The first insulating film 47 is formed from a Si oxide film (SiO, $SiO_2$), a Si nitride film (SiN, $Si_3N_4$) or a Si oxynitride film (SiON) and the like having film thicknesses of the order of 50 nm to 500 nm.

Next, using a resist pattern formed through the use of a widely known photolithography technique as a mask, a contact for connecting the connecting electrode 46 and the first interconnect 48 to the first insulating film 47 on the connecting electrode 46 is opened; and a metallic thin film which is used to form the first interconnect 48 is deposited by the sputtering method and the like. The first interconnect 48 is made of aluminum, copper, gold, titanium, tungsten, molybdenum or titanium-aluminum-vanadium and the like with film thicknesses of the order of 50 nm to 200 nm. Incidentally, it is not always necessary to provide the first interconnect 48.

Next, using a resist pattern formed through the use of a widely known photolithography technique as a mask, the patterning of the first interconnect 48 is performed so that a metallic thin film remains within the contact hole of the second contact section 43 and in the position corresponding to a first contact section 42.

Next, a metallic thin film which is used to form a second interconnect 49 is deposited by the sputtering method and the like. The second interconnect 49 is made of aluminum, copper, gold, titanium, tungsten, molybdenum or titanium-aluminum-vanadium and the like with film thicknesses of the order of 10 nm to 200 nm. The second interconnect 49 is used as a signal transmission path in the second supporting section 40.

Next, using a resist pattern formed through the use of a widely known photolithography technique as a mask, the patterning of the second interconnect 49 is performed so that the second interconnect 49 remains on the path from the first contact section 42 to the second contact section 43.

Next, a second insulating film 50 is deposited by the plasma CVD method and the like in such a manner as to cover the second interconnect 49. Also the second insulating film 50 is formed from a Si oxide film (SiO, $SiO_2$), a Si nitride film (SiN, $Si_3N_4$) or a Si oxynitride film (SiON) and the like having film thicknesses of the order of 50 nm to 500 nm.

Next, using a resist pattern formed through the use of a widely known photolithography technique as a mask, part of the first insulating film 47 and the second insulating film 50 positioned just below a diaphragm 38 are selectively removed so that the second supporting section 40 is formed. The patterning of the second supporting section 40 has also the effect of simultaneously partially exposing the polyimide of the first sacrifice layer.

Next, the second sacrifice layer used for forming a void between the diaphragm 38 and the Si substrate with a read-out circuit 45 is formed with the exception of the first contact section 42. The second sacrifice layer is formed, for example, by applying photosensitive polyimide, performing patterning by exposure and development, and thereafter being subjected to heat treatment. The thickness of the second sacrifice layer is on the order of 0.5 μm to 3 μm. Incidentally, the first sacrifice layer and the second sacrifice layer may be formed from the same material or may also be formed from different materials.

Next, a third insulating film 51 is deposited by the plasma CVD method and the like in such a manner as to cover the first contact section 42 and the second sacrifice layer. The third insulating film 51 is formed from a Si oxide film (SiO, $SiO_2$), a Si nitride film (SiN, $Si_3N_4$) or a Si oxynitride film (SiON) and the like having film thicknesses of the order of 50 nm to 500 nm.

Next, a film made of material which is used to form a bolometer thin film 52 is formed by the sputtering method and the like and the patterning of the bolometer thin film 52 is performed so that the material film remains in the position corresponding to the diaphragm 38. The bolometer thin 52 is made of vanadium oxide ($V_2O_3$, $VO_x$ etc.), titanium oxide ($TiO_x$) and the like having film thicknesses of the order of 30 nm to 200 nm.

Next, a fourth insulating film 53 is deposited by the plasma CVD method and the like in such a manner as to cover the bolometer thin film 52. The fourth insulating film 53 is formed from a Si oxide film (SiO, $SiO_2$), a Si nitride film (SiN, $Si_3N_4$) or a Si oxynitride film (SiON) and the like having film thicknesses of the order of 50 nm to 200 nm.

Next, using a resist pattern formed through the use of a widely known photolithography technique as a mask, in the fourth insulating film 53, a contact between the bolometer thin film 52 and a third interconnect 54 formed in the upper layer thereof and a contact between the second interconnect 49 of the first contact section 42 and the third interconnect 54 formed in the upper layer thereof are opened.

Next, a metallic thin film which is used to form the third interconnect 54 is deposited by the sputtering method and the like. The third interconnect 54 is made of aluminum, copper, gold, titanium, tungsten, molybdenum or titanium-aluminum-vanadium and the like with film thicknesses of the order of 10 nm to 200 nm.

Next, using a resist pattern formed through the use of a widely known photolithography technique as a mask, the patterning of the third interconnect 54 is performed so that the third interconnect 54 remains on the path from the end portion of the bolometer thin film 52 to the first supporting section 39. As a result of that, the bolometer thin film 52 is electrically connected to the connecting electrode 46 via the third interconnect 54, the second interconnect 49, and the first interconnect 48. Incidentally, FIGS. 8(a) and 8(b) schematically show the configuration of the section of the path crossing a slit 44 and therefore, the third interconnect 54 seems to be cut by the slit 44 on the outer side of the bolometer thin film 52. However, as shown in FIG. 7, the third interconnect 54 is formed continuously from the bolometer thin film 52 to the first contact section 42 by by-passing gap of the slit 44.

Next, furthermore, a fifth insulating film 55 is deposited by the plasma CVD method and the like in such a manner as to cover these films. The fifth insulating film 55 is formed from a Si oxide film (SiO, $SiO_2$), a Si nitride film (SiN, $Si_3N_4$) or a Si oxynitride film (SiON) and the like having film thicknesses of the order of 50 nm to 500 nm.

After that, as shown in FIGS. 2 to 5, characteristic steps in the manufacturing process of the thermal-type infrared solid-state image sensing device according to the first embodiment of the present invention are carried out. Incidentally, FIGS. 2 to 5 are sectional views each schematically showing the characteristic steps in the manufacturing process of the thermal-type infrared solid-state image sensing device according to the first embodiment of the present invention: a forming step of the reference section slit, a forming step of the light blocking Ti film (the lower layer of the film made of light blocking electrically conductive material) 10, a light blocking Al film (the upper layer of the film made of light blocking electrically conductive material) 11, and the SiN film for protecting the film made of light blocking electrically conductive material or the sacrifice layer 12, a forming step of an image sensing section slit, and an etching removal step of the sacrifice layer 7 of the image sensing region.

Figure 2:
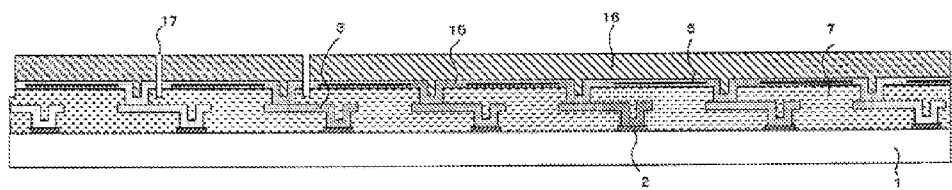
FIG. 2 is a sectional view showing a characteristic step of process used in a method of manufacturing the thermal-type infrared solid-state image sensing device according to the first embodiment of the present invention and shows a condition which is obtained by the completion of a step of forming a slit that pierces through protective films between which a thermoelectric conversion element is tucked only in a reference section (however, before the removal of a photoresist mask) after building tip partial structure prior to the formation of a slit which is used for forming a light receiving section of a light receiving element and a reference element by applying part of the steps of a conventional method (the manufacturing process disclosed in JP 2010-101756 A).

First, in the forming step of the reference section slit shown in FIG. 2, using a photoresist mask 16 provided with a reference section slit pattern 17, the insulating films which tuck the bolometer thin film 5 (the third insulating film 51, the fourth insulating film 53 and the fifth insulating film 55 in the thermal-type infrared solid-state image sensing device disclosed in JP 2010-101756 A) are removed and the reference section slit which reaches the sacrifice layer 7 (the second sacrifice layer in the thermal-type infrared solid-state image sensing device disclosed in JP 2010-101756 A) is formed. The width of the referenced section slit is, for example, on the order of 0.3 µm to 2 µm. Furthermore, in addition to the photoresist mask, a metal mask made of aluminum and the like may be used in the step of etching the insulating films.

Figure 3:
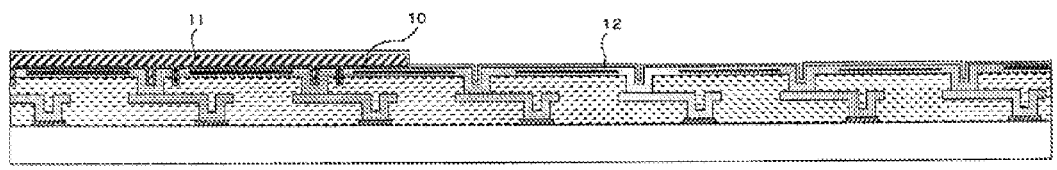
FIG. 3 is a sectional view showing a characteristic step of process used in the method of manufacturing the thermal-type infrared solid-state image sensing device according to the first embodiment of the present invention and shows a condition which is obtained by the completion of a step of forming a protective film after forming a film of electrically conductive material after the completion of the step shown in FIG. 2 and removal of the film of electrically conductive material except at least the reference section.

In the forming step of the light blocking Ti film (the lower layer of the film of light blocking electrically conductive material) 10, the light blocking Al film (the upper layer of the film made of light blocking electrically conductive material) 11, and the SiN film 12 for protecting the films made of light blocking electrically conductive material or the sacrifice layer which are shown in FIG. 3, first, the photoresist mask 16 which is used in the forming step of the reference section slit is removed. Next, the light blocking Ti film (the lower layer of the film made of light blocking electrically conductive material) 10 and the light blocking Al film (the upper layer of the film made of light blocking electrically conductive material) 11 are deposited by using the sputtering method, and the above-described film made of light blocking electrically conductive material having the two-layer construction is removed by etching, with exception that the film having the two-layer construction is left at least on the reference section without being etched off. After that, in order to coat the above-described film made of light blocking electrically conductive material having the two-layer construction, the SiN film 12 protecting the film made of light blocking electrically conductive material or the sacrifice layer is deposited on the reference section and the image sensing section by the plasma CVD method and the like. The film thickness of the light blocking Ti film (the lower layer of the film made of light blocking electrically conductive material) 10 is on the order of 30 nm to 200 nm, for example, the film thickness of the light blocking Al film (the upper layer of the film made of light blocking electrically conductive material) 11 is on the order of 100 nm to 1000 nm, for example, and the film thickness of the SiN film 12 for protecting the film made of light blocking electrically conductive material or the sacrifice layer is on the order to 30 nm to 200 nm, for example. However, as explained above, these film thicknesses is to be selected depending on the width of the reference section slit and are set so that a void remains within the slit. Incidentally, SiN film 12 for protecting the film made of light blocking electrically conductive material or the sacrifice layer that is formed on the image sensing section may be removed on the light receiving section 4 or on a predetermined region of the supporting section (first supporting section 39) that is formed in the same level as that of the light receiving section 4, and if such a configuration is selected, it is possible to reduce the residual stresses of the protective film (the SiN film 12 for protecting the film made of light blocking electrically conductive material or the sacrifice layer) itself.

Figure 4:
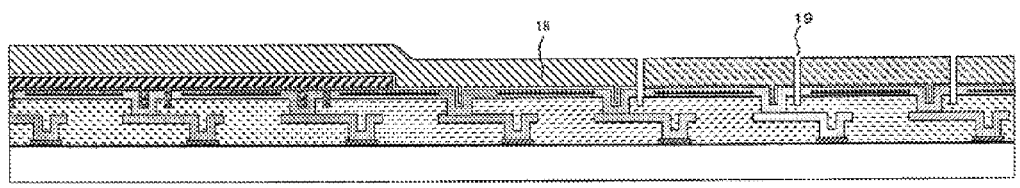
FIG. 4 is a sectional view showing a characteristic step of process used in the method of manufacturing the thermal-type infrared solid-state image sensing device according to the first embodiment of the present invention and shows a condition which is obtained by the completion of a step of forming a slit which pierces through the protective films that tuck the thermoelectric conversion element only in an image sensing section (however, before the removal of a photoresist mask) after the step shown in FIG. 3.

Next, in the forming step of the image sensing section slit shown in FIG. 4, using a photoresist mask 18 provided with an image sensing section slit pattern 19, the insulating films which tuck the bolometer thin film 5 (the third insulating film 51, the fourth insulating film 53, and the fifth insulating film 55 as well as the SiN film 12 for protecting the film of light blocking electrically conductive material or the sacrifice layer formed on the image sensing section in the thermal-type infrared solid-state image sensing device disclosed in JP 2010-101756 A) are removed, and the image sensing section slit which reaches the sacrifice layer 7 (the second sacrifice layer in the thermal-type infrared solid-state image sensing device disclosed in JP 2010-101756 A) is formed. It is preferred that the slit width of the reference section slit be made equal to the slit width of the image sensing section slit. Furthermore, in addition to the photoresist mask, a metal mask made of aluminum and the like may be used in the step of etching the insulating films.

Figure 5:
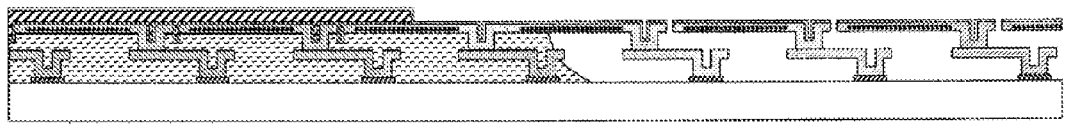
FIG. 5 is a sectional view showing a characteristic step of process used in the method of manufacturing the thermal-type infrared solid-state image sensing device according to the first embodiment of the present invention and shows a condition which is obtained by the completion of a step of removing a sacrifice layer of the image sensing section using the slit in the image sensing section after the step shown in FIG. 4.
Figure 6:
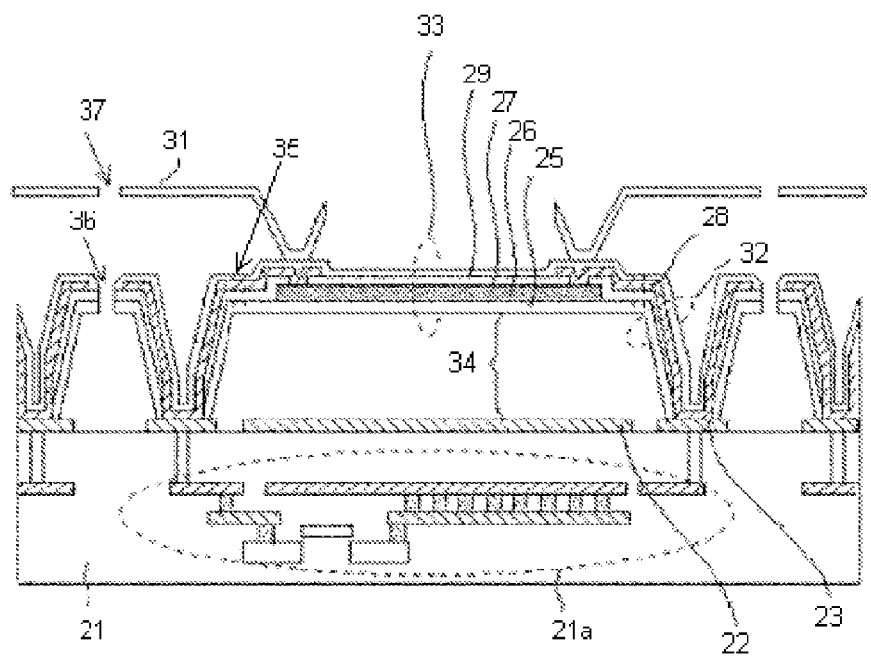
FIGS. 6(a) and 6(b) are sectional views showing the construction configuration of a thermal-type infrared solid-state image sensing device disclosed in JP 2009-192350 A.
Figure 6:
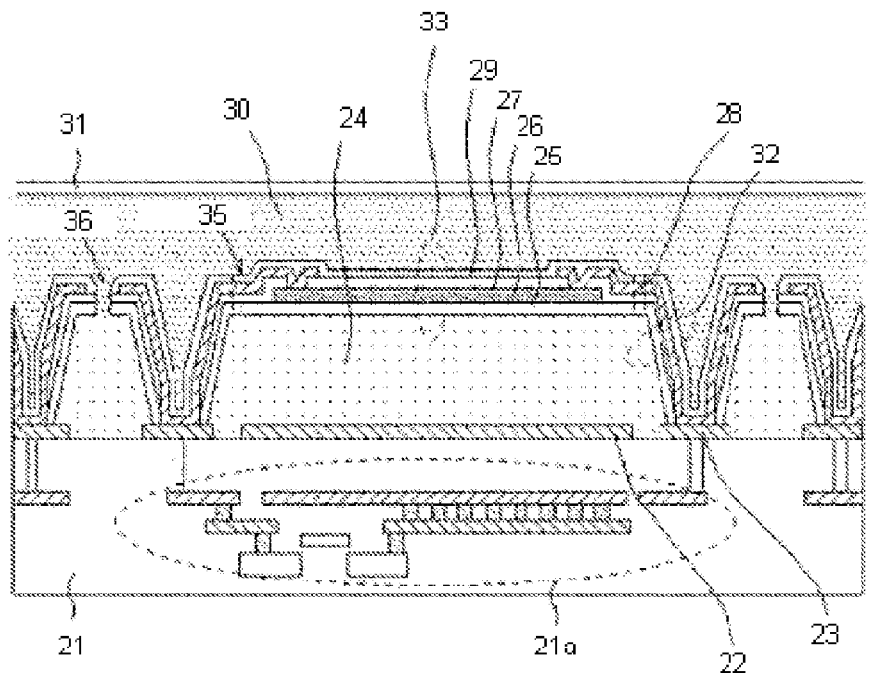

In the etching removal step of the sacrifice layer 7 of the image sensing region shown in FIG. 5, first, the photoresist mask 18 used in the forming step of the image sensing section slit is removed. Next, as shown in FIG. 5, the sacrifice layer 7 of the image sensing region (the second sacrifice layer and the first sacrifice layer in the thermal-type infrared solid-state image sensing device disclosed in JP 2010-101756 A) is removed by etching via the image sensing section slit, whereby a hollow section 6 of the light receiving element 13 is formed and the thermal-type infrared solid-state image sensing device according to the first embodiment of the present invention having the configuration shown in FIG. 1 is completed. In the step, as shown in FIG. 5, it is ensured that the etching of the sacrifice layer 7 is finished within the transition region between the reference section and the image sensing section.

As explained above, in the method of manufacturing a thermal-type infrared solid-state image sensing device according to the first embodiment of the present invention, after carrying out the series of steps prior to the formation of the slit which is used for forming the light receiving section of the light receiving element and the reference element are carried out in accordance with a conventional method (the manufacturing process disclosed in JP 2010-101756 A), only in the reference section, a slit which pierces through the insulating films which tuck the bolometer thin film (the reference section slit) is formed, the film of electrically conductive material is deposited, and the protective films are formed in the reference section and the protective film, thereafter, only in the image sensing section, a slit which pierces through the insulating films which tuck the bolometer thin film or the insulating films and the protective film (the image sensing section slit) is formed. The sacrifice layer of the image sensing section is removed via the slit (the image sensing section slit), whereby in the configuration in which the light receiving section (diaphragm) and the beam in the supporting section which determines the thermal isolation performance are respectively provided in different levels, even when a slit (the image sensing section slit) is formed in the reference section in order to reduce the resistance difference and the difference in the temperature coefficient of resistance due to the piezoresistance effect caused by residual stresses, it is possible to leave the sacrifice layer of the reference element without being etching off and it is possible to manufacture a thermal-type infrared solid-state image sensing device having high accuracy of drift suppression.

Incidentally, the process of manufacturing a thermal-type infrared solid-state image sensing device according to the first embodiment of the present invention in which the above-described steps shown in FIGS. 2 to 5 are employed, is an exemplary embodiment of the method of manufacturing the thermal-type infrared solid-state image sensing device according to the present invention. That is, the material and thickness of each component element, combinations, the order of removal and formation and the like can be appropriately modified as long as the construction of the thermal-type infrared solid-state image sensing device according to the present invention is obtained. For example, in the above explanation, when the light receiving section of the light receiving element and the reference element are formed in accordance with a conventional method (the manufacturing process disclosed in JP 2010-101756 A), a manufacturing process in which the third interconnect 54 is formed after the formation of the bolometer thin film 52 is employed. However, it is also possible to employ a manufacturing process in which the bolometer thin film 52 is formed after the formation of the third interconnect 54.

EXAMPLES (First Exemplary Embodiment)

Experimentally produced was a thermal-type infrared solid-state image sensing device which has effective 640×480 light receiving pixels in an image sensing section and is provided with a couple of reference sections having reference pixels in eight rows, which are respectively positioned above and below the image sensing section in its vertical direction. The slit widths of the image sensing section slit and the reference section slit are 0.5 µm. The film thickness of the surface layer of the light blocking Ti film was set to 50 nm, the film thickness of the surface layer of the light blocking Al film was set to 250 nm, and the film thickness of the surface layer of the SiN film for protecting the film made of light blocking electrically conductive material or the sacrifice layer was set to 50 nm. The film thickness of the surface layer of the above-described light blocking Ti film, light blocking Al film and protective SiN film with respect to the slit width of the reference section slit was set, and as a result of this, a void having an approximately 0.25 µm remained within the reference section slit. The total film thickness of the light receiving section protective film of the light receiving element became 350 nm as a result of the addition of the film thickness of the surface layer of SiN film for protecting the film made of the light blocking electrically conductive material or the sacrifice layer. As a result of performance test, the resistance difference and the difference in the temperature coefficient of resistance due to the piezoresistance effect between the light receiving element and the reference element were not more than the lower limits for measurement. In particular, the film made of electrically conductive material used in the reference section is effect to improve the light blocking and heat transfer effect. In such a case when an intense infrared light source is incident on the reference section, aliasing has hitherto been observed to a small extent for the conventional thermal-type infrared solid-state image sensing device, whereas any aliasing that is more than the lower limit of detection is not observed for the thermal-type infrared solid-state image sensing device produced in the first exemplary embodiment.

Although the present invention was explained by referring to the above-described embodiment (and exemplary embodiment), the present invention is not limited to the scope of the above-described embodiment (and exemplary embodiment). The configuration and details of the present invention are subject to various changes which those skilled in the art can understand within the scope of the present invention.

This application is based upon and claims benefit of priority from Japanese Patent Application No. 2011-067719, filed on Mar. 25, 2011, the entire contents of which are incorporated herein by reference.

[Industrial Applicability]

Examples of application of the thermal-type infrared solid-state image sensing device according to the present invention and the manufacturing method thereof include a night vision device (infrared camera) and a thermal-type infrared solid-state image sensing device that can be used in thermography, which are composed of bolometer type infrared detection elements, and a manufacturing method thereof. The employment of the configuration of the thermal-type infrared solid-state image sensing device according to the present invention is effective, in particular in reducing the pixel size composed of bolometer type infrared detection elements and in suppressing the drift of "zero signal level" caused by variations in the environmental temperature.

The invention claimed is:

1. A thermal-type infrared solid-state image sensing device, comprising: on a substrate,
    an image sensing section in which a plurality of light receiving elements which detect incident infrared rays are arranged in array; and
    a reference section in which at least one reference element which outputs a reference signal that is free from any influence of incident infrared rays is arranged,
    wherein
    the light receiving element and the reference element comprising which comprises a thermoelectric conversion element and a supporting section which supports the light receiving section spaced apart from the substrate, and
    the supporting section constructed in such a structure interlaying between the substrate and the light receiving section, two ends of which supporting section are respectively connected to the substrate and to the light receiving section, characterized in that
    the light receiving section of the light receiving element is thermally separated from the substrate by a hollow section that is formed by removing a sacrifice layer, and
    the light receiving section of the reference element is thermally connected to the substrate through the sacrifice layer which is left without being removed,
    wherein in the reference element, a slit that is used for forming the light receiving section of the reference element is formed in such a manner as to reach the sacrifice layer by piercing through insulating films between which the thermoelectric conversion element is tucked, at least one or more layers of films made of electrically conductive material are provided at least on the light receiving section and the slit, a protective film is further provided above at least the slit on the film made of electrically conductive material, the film made of electrically conductive material and the protective film cover over a side wall and a bottom portion of the slit, and thereby, a void remains in the interior of the slit, and
    wherein in the light receiving element, a slit that is used for forming the light receiving section of the light receiving element is formed in such a manner as to pierce through the insulating films or the insulating films and the protective film,
    wherein the film made of electrically conductive material is a layered films in which a film made of a material having a relatively bad step coverage is staked up on a film made of a material having a relatively good step coverage.

2. The thermal-type infrared solid-state image sensing device according to claim 1,
wherein the protective film is removed in a predetermined region on the light receiving section or a predetermined region on the supporting section which is formed at the same level as that of the light receiving section.

3. A method of manufacturing a thermal-type infrared solid-state image sensing device that comprises, on a substrate:
an image sensing section in which a plurality of light receiving elements that detect incident infrared rays are arranged in array, and
a reference section in which at least one reference element which outputs a reference signal that is free from any influence of incident infrared rays is arranged;
the light receiving element and the reference element comprising which comprises a thermoelectric conversion element and a supporting section which supports the light receiving section spaced apart from the substrate, and
the supporting section composed of a structure interlaying between the substrate and the light receiving section, a first connecting portion which connects one end of the structure and the substrate, and a second connecting portion which connects the other end of the structure and the light receiving section, characterized in that
at least, the method comprising the steps of:
forming a first sacrifice layer on the substrate in which a signal read-out circuit is formed with the exception of the area on a terminal electrode of the signal read-out circuit with which the first connecting portion of the supporting section is to be connected;
forming a first insulating film, an lower-layer metallic interconnect, and a second insulating film in the region which is used for construction of the first connecting portion and the structure of the supporting section;
forming a second sacrifice layer in the region which is used for construction of the light receiving section;
forming a third insulating film, an upper-layer metallic interconnect to be connected to the lower-layer metallic interconnect, a fourth insulating film, and a fifth insulating film in the region which is used for formation of the second connecting portion of the supporting section, and coincidentally, in the region which is used for construction of the light receiving section, forming also the third insulating film, the thermoelectric conversion element, the fourth insulating film, an upper-layer metallic interconnect to be connected with the end portion of the thermoelectric conversion element, the fourth insulating film and the fifth insulating film or alternatively forming the third insulating film, the upper-layer metallic interconnect, the fourth insulating film, the thermoelectric conversion element, and the fifth insulating film;
forming the light receiving section of the reference potion by forming a first slit piercing through the third to fifth insulating films in the reference section, forming a film made of electrically conductive material at least on the light receiving section and the first slit of the reference section and thereafter forming a protective film at least on the first slit, thereby forming a structure in which the film made of electrically conductive material and the protective film cover a side wall and a bottom of the first slit and a void remains in the first slit; and
forming the light receiving section of the image sensing section by forming a second slit piercing though the third to fifth insulating films or though the third to fifth insulating films and the protective film in the image sensing section and removing the first sacrifice layer and the second sacrifice layer of the image sensing section via the second slit,
wherein a film made of a material having a relatively good step coverage is stacked on a film made of a material having a relatively bad step coverage to be used as the film made of electrically conductive material.

4. A thermal-type infrared solid-state image sensing device, comprising: on a substrate,
an image sensing section in which a plurality of light receiving elements which detect incident infrared rays are arranged in array; and
a reference section in which at least one reference element which outputs a reference signal that is free from any influence of incident infrared rays is arranged,
wherein
the light receiving element and the reference element comprising a light receiving section which comprises a thermoelectric conversion element and a supporting section which supports the light receiving section spaced apart from the substrate, and
the supporting section constructed in such a structure interlaying between the substrate and the light receiving section, two ends of which supporting section are respectively connected to the substrate and to the light receiving section, characterized in that the light receiving section of the light receiving element is thermally separated from the substrate by a hollow section that is formed by removing a sacrifice layer, and
the light receiving section of the reference element is thermally connected to the substrate through the sacrifice layer which is left without being removed,
wherein in the reference element, a slit that is used for forming the light receiving section of the reference element is formed in such a manner as to reach the sacrifice layer by piercing through insulating films between which the thermoelectric conversion element is tucked, at least one or more layers of films made of electrically conductive material are provided at least on the light receiving section and the slit, a protective film is further provided above at least the slit on the film made of electrically conductive material, the film made of electrically conductive material and the protective film cover over a side wall and a bottom portion of the slit, and thereby, a void remains in the interior of the slit,
wherein the side wall and bottom portion of the slit is partially embedded in the sacrifice layer, and
wherein in the light receiving element, a slit that is used for forming the light receiving section of the light receiving element is formed in such a manner as to pierce through the insulating films or the insulating films and the protective film.

5. The thermal-type infrared solid-state image sensing device according to claim 4,
wherein the film made of electrically conductive material is a layered films in which a film made of a material having a relatively bad step coverage is stacked up on a film made of a material having a relatively good step coverage.

6. The thermal-type infrared solid-state image sensing device according to claim 4,
wherein the protective film is removed in a predetermined region on the light receiving section or a predetermined region on the supporting section which is formed at the same level as that of the light receiving section.

* * * * *